United States Patent
Beck et al.

(10) Patent No.: US 10,458,014 B2
(45) Date of Patent: Oct. 29, 2019

(54) THIN-FILM DEPOSITION METHODS WITH THERMAL MANAGEMENT OF EVAPORATION SOURCES

(71) Applicant: Siva Power, Inc., Santa Clara, CA (US)

(72) Inventors: Markus Eberhard Beck, Scotts Valley, CA (US); Ulrich Alexander Bonne, Sunnyvale, CA (US)

(73) Assignee: SIVA POWER, INC., San Jose, CA (US)

( * ) Notice: Subject to any disclaimer, the term of this patent is extended or adjusted under 35 U.S.C. 154(b) by 358 days.

(21) Appl. No.: 15/078,605

(22) Filed: Mar. 23, 2016

(65) Prior Publication Data

US 2016/0281211 A1 Sep. 29, 2016

Related U.S. Application Data

(60) Provisional application No. 62/137,263, filed on Mar. 24, 2015.

(51) Int. Cl.
*C23C 14/24* (2006.01)

(52) U.S. Cl.
CPC .................. *C23C 14/243* (2013.01)

(58) Field of Classification Search
CPC .................. C23C 14/243; H01L 21/02274
See application file for complete search history.

(56) References Cited

U.S. PATENT DOCUMENTS

| | | | |
|---|---|---|---|
| 5,253,266 A * | 10/1993 | Knodle, III | C30B 23/066 118/726 |
| 6,296,894 B1 | 10/2001 | Tanabe et al. | |
| 2005/0016463 A1 | 1/2005 | Hirano | |
| 2007/0148351 A1 * | 6/2007 | Yamazaki | C23C 14/042 427/255.5 |
| 2011/0101245 A1 | 5/2011 | Hu | |
| 2011/0259316 A1 * | 10/2011 | Pelletier | C30B 11/003 126/343.5 R |
| 2012/0156372 A1 * | 6/2012 | Birkmire | C23C 14/0021 427/248.1 |
| 2013/0276706 A1 | 10/2013 | Lee et al. | |
| 2014/0007814 A1 * | 1/2014 | Villette | C23C 14/243 118/727 |
| 2014/0299060 A1 | 10/2014 | Na et al. | |

OTHER PUBLICATIONS

International Search Report and Written Opinion issued in a corresponding International Application No. PCT/US2016/023766 dated Jul. 19, 2016.

\* cited by examiner

*Primary Examiner* — Joel G Horning
(74) *Attorney, Agent, or Firm* — Morgan, Lewis & Bockius LLP

(57) ABSTRACT

In various embodiments, evaporation sources for deposition processes have disposed therearound an insulation material configurable to fit snugly around the source body of the evaporation source and to be at least partially distanced away from the source body to expedite heat transfer therefrom.

23 Claims, 9 Drawing Sheets

THIN-FILM DEPOSITION METHODS WITH THERMAL MANAGEMENT OF EVAPORATION SOURCES

RELATED APPLICATION

This application claims the benefit of and priority to U.S. Provisional Patent Application No. 62/137,263, filed Mar. 24, 2015, the entire disclosure of which is hereby incorporated herein by reference.

TECHNICAL FIELD

In various embodiments, the present invention relates to thermal evaporation, in particular to thermal management of evaporation sources.

BACKGROUND

Thermal evaporation is a well-known approach to forming a number of materials such as III-V solid-state semiconductors via molecular beam epitaxial (MBE) growth. Another commercial application of this technique is the evaporation of Al onto polymer foils for the packaging industry or other metals onto polymer foils for capacitor manufacturing. In these applications, the sources are typically point sources either of the Knudsen cell design or the open boat design. Point sources are also used in manufacturing of thin-film photovoltaic (PV) devices, in particular copper indium gallium selenide ($CuIn_xGa_{1-x}Se_2$ or CIGS) devices. In addition, fabrication techniques for large-area organic light-emitting diode (OLED) devices typically employ thermal evaporation sources. Due to their large-area substrates and required uniformity of the deposited layers, thermal evaporation sources utilized for OLEDs are typically of the linear type.

Given the cost sensitivity of commercial products—in particular for PV—manufacturing requires long system run times and short system turnaround (green-to-green) times. Thus, evaporation sources typically hold significant volumes of feedstock to enable long-run campaigns. Coupled with the desire to increase throughput, high deposition rates and large-area substrates are essential to enabling lower manufacturing costs. Therefore, conventional high-throughput thermal evaporation sources have significant thermal mass and/or utilize continuous feed of the source material. For some materials continuous feed is a possibility (e.g., Al wire feed), while for many others it is not.

Conventional systems with high thermal mass have the added advantage that control of the thermal evaporation process is simplified as temperature fluctuations based on power fluctuations to the heaters are typically negligible. Highly effective thermal insulation further reduces sensitivity to incoming power fluctuations. Such thermal insulation also reduces heat losses to the surroundings, i.e., it increases thermal coupling efficiency of the electrical heater power to the material to be evaporated, leading to lower operating costs. In summary, high thermal mass and highly effective thermal insulation are important aspects of conventional industrial thermal evaporation processes.

In addition, turnaround times typically need to be short for industrial deposition processes. However, if the thermal evaporation source has a high thermal mass and highly effective insulation, the cool-down of the source between deposition runs will necessarily be slow. The impact is most severe if an unscheduled maintenance event necessitates shutdown of the equipment with the large feedstock volume sources still holding significant amounts of feedstock. But even if the feedstock has been depleted, the body of the evaporation source itself still has significant thermal mass.

In view of the foregoing, there is a need for improved thermal-management systems and techniques for thermal evaporation that maintain high-quality insulation (and concomitant insensitivity to power fluctuations) during deposition cycles and that provide faster cooling and shorter turnaround times between deposition cycles.

SUMMARY

Embodiments of the present invention weaken the insulation around a thermal-deposition source only when fast cool-down is desirable. Embodiments of the invention utilize modular insulation designs and mechanisms to actively manipulate the efficacy of the insulation during and between deposition processes.

The effectiveness of the manipulation of thermal insulation in many cases depends on the temperature regime. Thermal evaporation processes typically are performed in vacuum ambients having very little background gas. This is necessary to reduce scattering of the material being evaporated to assure effective material transport from the evaporation source to the substrate upon which the evaporated material is to condense. However, small background pressure of a reactive species may exist when reactive evaporation processes are desired—as is the case in CIGS co-evaporation where a small selenium background pressure ambient is created into which the Cu, In and Ga are evaporated. The background pressure is typically less than 1 mTorr. As such, the primary loss of thermal energy in vacuum is via radiation, i.e., long-wavelength electromagnetic radiation. However, this process starts to lose effectiveness the lower the temperature of the body to be cooled and the smaller the temperature difference between the body cooling down and the system absorbing the thermal energy. Thus, in a vacuum environment cooling via radiation is typically most effective above approximately 300° C.

Convection is another cooling technique. In convection processes, another medium, e.g., a gas or liquid, passes over or through the body to be cooled and is able to transfer the thermal energy to a colder surface or colder matter nearby. Given that thermal evaporation processes are by necessity under vacuum, hardly any heat is lost via conduction. However, at the end of the process it is possible to backfill the deposition equipment with a gas—an operation which may be repeated in fill/purge sequences where small amounts of gas are introduced for short periods of times and then pumped out of the system again as they have heated up and become less effective in transferring heat away from the hot body. While this process has been utilized in existing systems, it has limitations based on the types of gases that are applicable. Air, the lowest cost gas mixture available, is not suitable as components in the vacuum system will oxidize. Nitrogen, another economical gas, has limited use as well, as it may only be utilized below particular temperatures, as many materials will react with nitrogen. Moreover, both oxygen and nitrogen, like most gases, have relatively low heat capacities and are therefore less effective in convective cooling compared to, e.g., liquids. Noble or other inert gases will not react with any of the materials inside the deposition system, but are typically more expensive or have even lower heat capacities than nitrogen. For example, argon has a heat capacity only one-half that of nitrogen. On the other hand, at five times the heat capacity of nitrogen, helium (He) has the highest heat capacity of gases—apart from hydrogen (H)—and is extremely inert. But its cost is significantly higher than that of nitrogen.

In addition, since for low power consumption and stable processes the evaporation source relies on highly effective thermal insulation, it is often difficult to accomplish convection cooling. The details largely depend on the type of insulation scheme. For example, if insulation is via shielding, a gas may penetrate the gap between the various layers of shielding, but if solid insulation is employed, the effect of convection cooling is limited by the rate of heat transfer (thermal conductivity) through the solid insulation.

Liquids typically have higher heat capacities than gases, although not as high as H or He, but a limitation for the use of liquids stems from the temperature at which materials are typically thermally evaporated. Heat transfer fluids typically have a maximum continuous operating temperature not exceeding 400° C., limiting the approach of employing a liquid to convectively cool a thermal evaporation source.

Moreover, apart from undesirable cooling by conduction via support mounts for the thermal evaporation sources in the vacuum system, conduction is not a practical heat-transfer process for thermal evaporation sources. The effectiveness of conductive cooling is highly dependent on the contact surface between the hot and cold matter. Given that roughness is measured at the atomic level, uneven surfaces resulting from machining processes are inevitable; additionally, finite machining tolerances and thermal deformation at operating temperatures of the thermal evaporation sources ensure that it is difficult to bring a cold body into direct contact with the thermal evaporation source for cool-down. Furthermore, heat transfer diminishes in direct proportion to a drop in the temperature difference of the two bodies, and cooling the colder body is subject to the same limitations described above. Finally, the low thermal conductivity insulation around the evaporation source prevents direct contact with the hot components, as such rendering conduction more or less impractical.

Embodiments of the invention overcome the limitations of conventional cooling techniques by compromising the thermal evaporation source's thermal insulation only when higher rates of heat loss (and therefore temperature change) are desired, rather than while evaporated material is actually being deposited. Specifically, the thermal insulation efficacy may be compromised after (or between) thermal-evaporation processes, as well as during evaporation processes when rapid transitions from one temperature set-point to another are desired. During process temperature changes, the effectiveness of the insulation may be compromised until the next (typically lower) temperature is reached, whereupon high thermal-insulation performance may be reestablished. In this manner, thermal-evaporation processes in accordance with embodiments of the invention retain the benefits of highly effective thermal insulation during evaporation while incorporating faster cool-down and turnaround times than those enabled by conventional systems. Specifically, embodiments of the present invention utilize modular and/or movable (i.e., repositionable) thermal insulation around thermal-evaporation sources. The thermal evaporation remains tightly disposed around the thermal-evaporation source during the evaporation process, thereby ensuring high-quality insulation. After the completion of the evaporation process or to quickly establish a new, lower evaporation temperature, the insulation is moved away from the immediate vicinity of the source, weakening the insulation and enabling faster cooling rates. In some embodiments, the insulation is moved from the source to reveal the cooler walls of the deposition chamber, thereby enabling faster cooling of the source via, e.g., radiation and/or convection.

Embodiments of the invention advantageously utilize materials for thermal insulation that have poor thermal conductivity and are compatible with high temperatures utilized in evaporation processes. For example, insulation materials usable in accordance with embodiments of the invention include graphite or carbon-fiber composite (CFC) foils, felts, or foams, as well as combinations thereof. Other insulation materials in accordance with embodiments of the invention include ceramics such as mullite ($3Al_2O_3:2SiO_2$ or $2Al_2O_3:SiO_2$), alumina ($Al_2O_3$), silica ($SiO_2$), and/or zirconia ($ZrO_2$). The insulation may take the form of a sol gel, a foam, a plurality of fibers (i.e., a felt), or a series of spaced-apart shields (that may include, consist essentially of, or consist of, for example, tantalum, niobium, and/or molybdenum).

The insulation material is typically sized and shaped to surround most or all of the evaporation source, save for the opening of the evaporation port through which the evaporated material leaves the source for deposition on a substrate. The insulation may be provided in discrete sections that are fitted snugly together around the source, or the insulation may incorporate hinges or other fasteners that enable the motion of at least a portion of the insulation away from the source after an evaporation process is completed. In some embodiments, the insulation is built into the evaporation chamber itself, thus forming an insulated chamber into which the evaporation source is inserted for evaporation processes. All or a portion of the insulated chamber may be movable in order to weaken its performance after completion of the evaporation process. This motion of the insulation may provide a line-of-sight between the hot evaporation source and the cooler walls of the deposition chamber, as mentioned above.

Variable thermal insulation for evaporation sources in accordance with embodiments of the invention may be utilized in various processes, such as MBE of III-V materials, deposition of OLED materials, and materials for thin-film photovoltaics, e.g., chalcopyrites ($Cu(In,Ga)(S,Se)_2$) such as CIGS or kesterites ($Cu_2(Zn,Fe)Sn(S,Se)_4$) such as CZTS (copper zinc tin sulfide). For higher temperature evaporation processes (e.g., processes performed at temperatures greater than or equal to approximately 400° C.), embodiments of the present invention reduce cost of ownership in manufacturing.

During deposition processes utilizing evaporation sources in accordance with embodiments of the invention, a processing ambient may be established within the deposition chamber by, for example, evacuating at least a portion of gas disposed within the deposition chamber, thereby establishing a vacuum ambient therein, and/or introducing one or more process gases (e.g., hydrogen, oxygen, etc.), one or more of which may be reactive (e.g., with the evaporant) within the deposition chamber. The evaporation source is then heated such that at least a portion of the feedstock material within the source vaporizes and exits the source body through the evaporation port. At least a portion of the vaporized material subsequently deposits on a substrate disposed within the deposition chamber to form a thin film on the substrate. One or more portions of segmented and/or movable insulation may be moved away from the source body after the deposition process or during a desired temperature change between two stages of a multi-stage deposition process. Such insulating portions may be moved back around the source body after the temperature of the source body has decreased by a desired amount (which may be measured by one or more temperature sensors) or after a certain amount of time has elapsed. The movement of the insulating material may be performed while the processing ambient is established within the deposition chamber and/or during introduction of one or more inert gases within the deposition chamber. The source body may remain stationary (i.e., may not itself be moved) within the deposition chamber when the insulation is moved away and toward the source body.

Deposition chambers in accordance with embodiments of the invention may feature therewithin one or more evaporation sources, and each evaporation source may have insulation disposed therearound. In various embodiments, two or more evaporation sources may share insulation, i.e., may be surrounded by the same insulation material.

In an aspect, embodiments of the invention feature a method of thin-film deposition. An evaporation source is provided within a deposition chamber. The evaporation source includes, consists essentially of, or consists of a source body containing a feedstock material and an evaporation port fluidly coupling the source body with an interior of the deposition chamber. The evaporation port may include, consist essentially of, or consist of one or more openings defined by the source body. The evaporation port may include an elongated portion extending away from the source body. An insulation material is disposed around the evaporation source to reduce heat loss therefrom. A processing ambient is established within the deposition chamber by (i) evacuating at least a portion of gas disposed within the deposition chamber, thereby establishing a vacuum ambient therein, and/or (ii) introducing a process gas within the deposition chamber. The evaporation source is heated, whereby at least a portion of the feedstock material vaporizes, exits the source body through the evaporation port, and is deposited on a substrate within the deposition chamber, thereby forming at least a portion of a thin film. After the evaporation source is heated (e.g., after at least a portion of the thin film is formed), at least a portion of the insulation is moved away from the evaporation source, thereby enhancing heat transfer (e.g., heat loss) therefrom.

Embodiments of the invention may include one or more of the following in any of a variety of combinations. The process gas may be introduced within the deposition chamber. The process may react with the vaporized feedstock material. The insulation material may include, consist essentially of, or consist of a plurality of discrete segments. Moving at least a portion of the insulation material away from the evaporation source may include, consist essentially of, or consist of moving one or more of the segments away from the evaporation source. One or more segments of the insulation material may remain disposed proximate the evaporation source when one or more other segments of the insulation material are moved away from the evaporation source. Moving at least a portion of the insulation material away from the evaporation source may include, consist essentially of, or consist of establishing a line of sight between at least a portion of the source body and a wall (e.g., an interior wall) of the deposition chamber. The wall may have a temperature lower than a temperature of the evaporation source. The insulation material may include, consist essentially of, or consist of carbon and/or a ceramic material. The insulation material may include, consist essentially of, or consist of graphite, carbon fiber, mullite, alumina, silica, and/or zirconia. The insulation material may include, consist essentially of, or consist of tantalum, niobium, and/or molybdenum. The insulation material may include, consist essentially of, or consist of a felt, a foam, a sol gel material, or a plurality of spaced-apart solid shields. Moving at least a portion of the insulation material away from the evaporation source may include, consist essentially of, or consist of opening the insulation material at one or more hinged points. The at least a portion of the insulation material may be moved away from the evaporation source in the processing ambient. The at least a portion of the insulating material may be disposed proximate the evaporation source (e.g., in the configuration around the evaporation source it was in before it was moved) to reduce heat loss therefrom while remaining in the processing ambient and after a temperature of the evaporation source has decreased by a desired amount.

In another aspect, embodiments of the invention feature a thermal evaporation source that includes, consists essentially of, or consists of a hollow source body for containing a feedstock material for evaporation thereof, an evaporation port for fluidly coupling the source body with an interior of a deposition chamber, and a segmented insulation material configurable in (i) a first configuration in which a plurality of segments are each disposed snugly around the source body and (ii) a second configuration in which one or more of the segments are distanced away from the source body to allow heat loss therefrom.

Embodiments of the invention may include one or more of the following in any of a variety of combinations. The source body may contain a feedstock material therewithin. Two or more of the segments of insulation material may be connected at hinged points. Two or more of the segments of insulation material may be fully separable from each other. One or more of the segments of the insulation material may be configured to remain proximate (or in direct mechanical contact with) the source body in both the first configuration and the second configuration. The insulation material may include, consist essentially of, or consist of carbon and/or a ceramic material. The insulation material may include, consist essentially of, or consist of graphite, carbon fiber, mullite, alumina, silica, and/or zirconia. The insulation material may include, consist essentially of, or consist of tantalum, niobium, and/or molybdenum. The insulation material may include, consist essentially of, or consist of a felt, a foam, a sol gel material, or a plurality of spaced-apart solid shields.

In yet another aspect, embodiments of the invention feature a deposition system that includes, consists essentially of, or consists of an evaporation chamber (i.e., a deposition chamber) having an interior enclosed by one or more chamber walls, an evaporation source, and a segmented insulation material. The evaporation source includes, consists essentially of, or consists of a hollow source body for containing a feedstock material for evaporation thereof and an evaporation port for fluidly coupling the source body with the interior of a deposition chamber. The segmented insulation material is configurable in (i) a first configuration in which a plurality of segments are each disposed snugly around the source body and (ii) a second configuration in which one or more of the segments are distanced away from the source body.

Embodiments of the invention may include one or more of the following in any of a variety of combinations. When the segmented insulation material is configured in the second configuration, a direct line of sight between at least one chamber wall of the evaporation chamber and at least a portion of the evaporation source may be established. The source body may contain a feedstock material therewithin. Two or more of the segments of insulation material may be connected at hinged points. Two or more of the segments of insulation material may be fully separable from each other.

One or more of the segments of the insulation material may be configured to remain proximate (or in direct mechanical contact with) the source body in both the first configuration and the second configuration. The insulation material may include, consist essentially of, or consist of carbon and/or a ceramic material. The insulation material may include, consist essentially of, or consist of graphite, carbon fiber, mullite, alumina, silica, and/or zirconia. The insulation material may include, consist essentially of, or consist of tantalum, niobium, and/or molybdenum. The insulation material may include, consist essentially of, or consist of a felt, a foam, a sol gel material, or a plurality of spaced-apart solid shields. The deposition system may include one or more positioners for configuring the segmented insulation material into the first configuration and the second configuration. One or more of the positioners may include, consist essentially of, or consist of an actuator, a motor, a linear actuator, a hydraulic cylinder, a pneumatic actuator, a worm gear, a screw jack, a stepper motor, a telescoping rod, and/or an electric actuator. The deposition system may include a control system for controlling the one or more positioners.

In another aspect, embodiments of the invention feature a method of thin-film deposition. An evaporation source is provided within a deposition chamber. The evaporation source includes, consists essentially of, or consists of a source body containing a feedstock material and an evaporation port fluidly coupling the source body with an interior of the deposition chamber. The evaporation port may include, consist essentially of, or consist of one or more openings defined by the source body. The evaporation port may include an elongated portion extending away from the source body. The evaporation source is insulated to reduce heat loss therefrom. A processing ambient is established within the deposition chamber by (i) evacuating at least a portion of gas disposed within the deposition chamber, thereby establishing a vacuum ambient therein, and/or (ii) introducing a process gas within the deposition chamber. The evaporation source is heated, whereby at least a portion of the feedstock material vaporizes, exits the source body through the evaporation port, and is deposited on a substrate within the deposition chamber, thereby forming at least a portion of a thin film. After the evaporation source is heated (e.g., after at least a portion of the thin film is formed), the insulation of the evaporation source is reduced (e.g., weakened in insulation efficacy or efficiency and/or reduced in thickness and/or volume), thereby enhancing heat transfer (e.g., heat loss) therefrom.

Embodiments of the invention may include one or more of the following in any of a variety of combinations. The process gas may be introduced within the deposition chamber. The process may react with the vaporized feedstock material. Insulating the evaporation source may include, consist essentially of, or consist of disposing a plurality of discrete segments of insulation material around the evaporation source. Reducing the insulation of the evaporation source may include, consist essentially of, or consist of moving one or more of the segments away from the evaporation source. One or more segments of the insulation material may remain disposed proximate the evaporation source when one or more other segments of the insulation material are moved away from the evaporation source. Moving one or more of the segments of the insulation material away from the evaporation source may include, consist essentially of, or consist of opening the insulation material at one or more hinged points. The insulation of the evaporation source may be reduced in the processing ambient. The insulation of the evaporation source may be increased (e.g., to the level of insulation present before the insulation was reduced, or to a level greater or less than that level) to reduce heat loss from the evaporation source while remaining in the processing ambient and after a temperature of the evaporation source has decreased by a desired amount. Reducing the insulation of the evaporation source may include, consist essentially of, or consist of establishing a line of sight between at least a portion of the source body and a wall (e.g., an interior wall) of the deposition chamber. The wall may have a temperature lower than a temperature of the evaporation source. Insulating the evaporation source may include, consist essentially of, or consist of disposing an insulation material around the evaporation source. Reducing the insulation of the evaporation source may include, consist essentially of, or consist of moving at least a portion of the insulating material away from the evaporation source. The insulation material may include, consist essentially of, or consist of carbon and/or a ceramic material. The insulation material may include, consist essentially of, or consist of graphite, carbon fiber, mullite, alumina, silica, and/or zirconia. The insulation material may include, consist essentially of, or consist of tantalum, niobium, and/or molybdenum. The insulation material may include, consist essentially of, or consist of a felt, a foam, a sol gel material, or a plurality of spaced-apart solid shields.

In yet another aspect, embodiments of the invention feature a deposition system that includes, consists essentially, or consists of an evaporation chamber (i.e., a deposition chamber) having an interior enclosed by one or more chamber walls, an evaporation source, an insulation material, and a controller (e.g., a computer-based controller). The evaporation source includes, consists essentially of, or consists of a hollow source body for containing a feedstock material for evaporation thereof and an evaporation port for fluidly coupling the source body with the interior of the deposition chamber. The controller configures the insulation material in (i) a first configuration in which the insulation material is disposed snugly around the source body and (ii) a second configuration in which at least a portion of the insulation material is distanced away from the source body.

Embodiments of the invention may include one or more of the following in any of a variety of combinations. When the insulation material is configured in the second configuration, a direct line of sight between at least one chamber wall of the deposition chamber and at least a portion of the evaporation source may be established. The source body may contain a feedstock material therewithin. In the second configuration, substantially all of the insulation material may be distanced away from the source body. In the second configuration, only a portion of the insulation material may be disposed proximate to and/or in direct mechanical contact with the source body. The insulation material may be segmented into a plurality of segments that may be connected to each other or discrete and separate from each other. Two or more of the segments of insulation material may be connected at hinged points. Two or more of the segments of insulation material may be fully separable from each other. One or more of the segments of the insulation material may be configured to remain proximate (or in direct mechanical contact with) the source body in both the first configuration and the second configuration. The insulation material may include, consist essentially of, or consist of carbon and/or a ceramic material. The insulation material may include, consist essentially of, or consist of graphite, carbon fiber, mullite, alumina, silica, and/or zirconia. The insulation material may include, consist essentially of, or consist of tantalum, niobium, and/or molybdenum. The insulation material may include, consist essentially of, or consist of a felt, a foam, a sol gel material, or a plurality of spaced-apart solid shields. The deposition system may include one or more positioners for configuring the insulation material into the first configuration and the second configuration in response to the controller. One or more of the positioners may include, consist essentially of, or consist of an actuator, a motor, a linear actuator, a hydraulic cylinder, a pneumatic actuator, a worm gear, a screw jack, a stepper motor, a telescoping rod, and/or an electric actuator.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately" and "substantially" mean±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
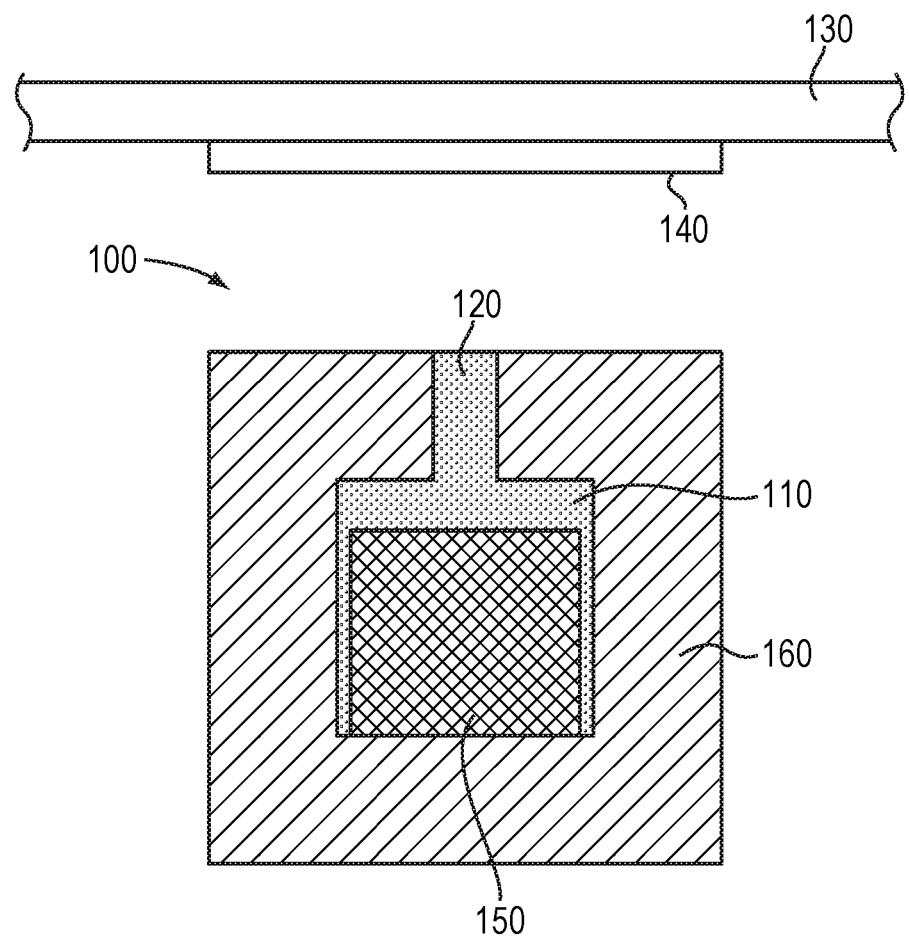
FIG. 1 is a schematic cross-section of an evaporation source disposed within a deposition system in accordance with various embodiments of the invention.

FIG. 1 is a schematic cross-section of an exemplary insulated thermal-evaporation source 100 in accordance with embodiments of the present invention. As shown, the source 100 includes or consists essentially of a hollow body 110 and an evaporation port 120 that enables evaporation of material from the body 110 into the deposition chamber (which may be partially or substantially completely enclosed by one or more chamber walls 130) and onto a substrate 140 positioned within the chamber. For deposition processes, the body 110 of the source 100 contains a feedstock material 150 that is heated (e.g., melted or sublimated) to produce the evaporant (i.e., evaporated material) that travels through the port 120 toward the substrate 140. Exemplary feedstock materials 150 in accordance with embodiments of the invention include copper (Cu), aluminum (Al), indium (In), gallium (Ga), zinc (Zn), tin (Sn), and silver (Ag). The source 100 is at least partially surrounded by thermal insulation 160 that decreases or substantially prevents heat loss from the source 100 and substantially prevents temperature fluctuations in the source 100 due to, e.g., power fluctuations in the furnace (or other heating system or mechanism) that heats the source 100. As shown, in various embodiments the thermal insulation 160 surrounds the source body 110 while leaving exposed the opening of the evaporation port 120, thereby permitting the evaporated material to exit the source 100.

FIG. 1 depicts the insulated thermal-evaporation source 100 having its evaporation port 120 facing upward, but other orientations of the port 120 are possible. For example, the port 120 may be oriented to allow evaporant release sideways (i.e., laterally) or even downward. Moreover, the thickness of the insulation 160 disposed around the source body 110 need not have approximately the same thickness around all sides of the body 110. In addition, while the evaporation port 120 is depicted in FIG. 1 as being a substantially straight regular cylinder, in various embodiments the evaporation port 120 has a width or diameter that tapers (wider or narrower) as a function of distance from the source body 110.

Figure 2A:
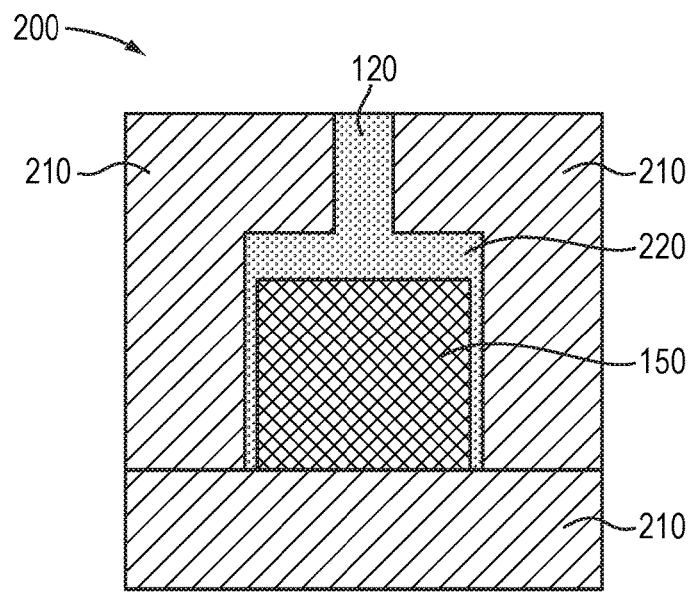
FIG. 2A is a schematic cross-section of an evaporation source having segmented insulation in a closed configuration in accordance with various embodiments of the invention.
Figure 2B:
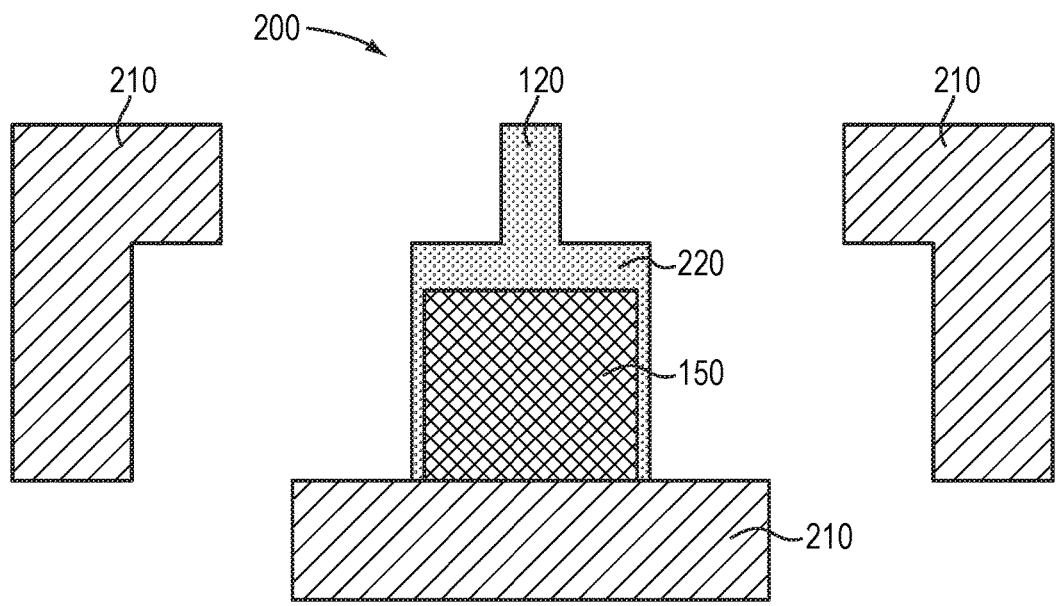
FIG. 2B is a schematic cross-section of the evaporation source of FIG. 2A with segmented insulation in an open configuration in accordance with various embodiments of the invention.

FIGS. 2A and 2B are cross-sectional schematics of an insulated thermal-evaporation source 200 featuring segmented (i.e., modular) insulation 210 in accordance with various embodiments of the present invention. In FIG. 2A, the insulation 210 is snugly positioned around a source body 220 of the source 200, thereby providing the maximum amount of thermal insulation for the source 200. The source body 220 is typically a hollow container for containing the feedstock material 150 during evaporation thereof. The source body 220 may include, consist essentially of, or consist of, for example, one or more refractory metals (e.g., tantalum, tungsten, and/or molybdenum) and/or one or more ceramic materials such as alumina and/or boron nitride. In various embodiments, one or more surfaces of the source body (e.g., the surfaces facing and/or in contact with the feedstock material 150) may be coated or lined with a lining material, e.g., a ceramic material such as alumina and/or boron nitride. The source body 220 and the insulation material therearound may be heated by one or more heaters disposed proximate or around the evaporation source. The one or more heaters may include or consist essentially of, for example, a furnace in which the source is disposed or one or more resistive heaters disposed around the source.

The "closed" configuration of FIG. 2A may be utilized, for example, during an evaporation process. FIG. 2B depicts the insulated source 200 in a configuration in which one or more of the segments of the insulation 210 have been moved away from the source body 220, thereby enabling faster cool-down thereof. As shown, one or more segments of the insulation 210 may remain disposed closely proximate or even in contact with the evaporation source body 220, even in the "open" configuration of FIG. 2B. In other embodiments, all of the segments of the insulation 210 are moved away from the source body 220 in the open configuration. Open configurations such as the configuration of FIG. 2B may be utilized, for example, after an evaporation process.

Figure 3A:
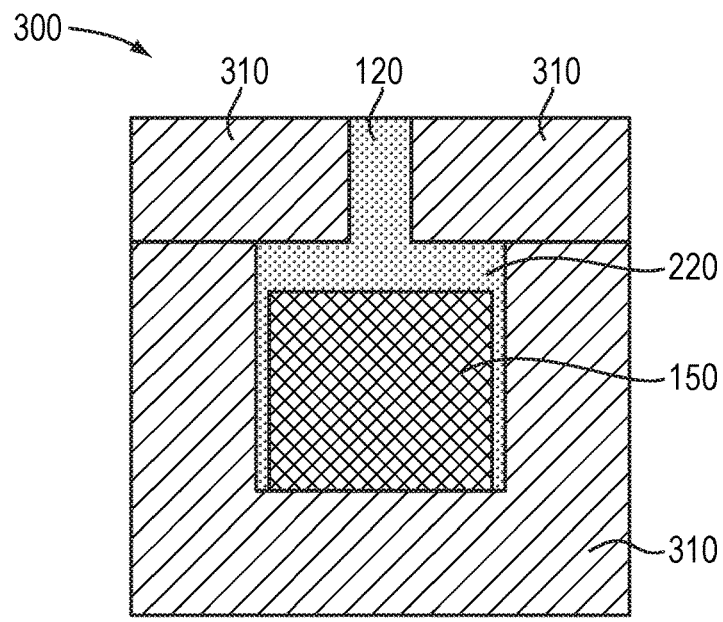
FIG. 3A is a schematic cross-section of an evaporation source having segmented insulation in a closed configuration in accordance with various embodiments of the invention.
Figure 3B:
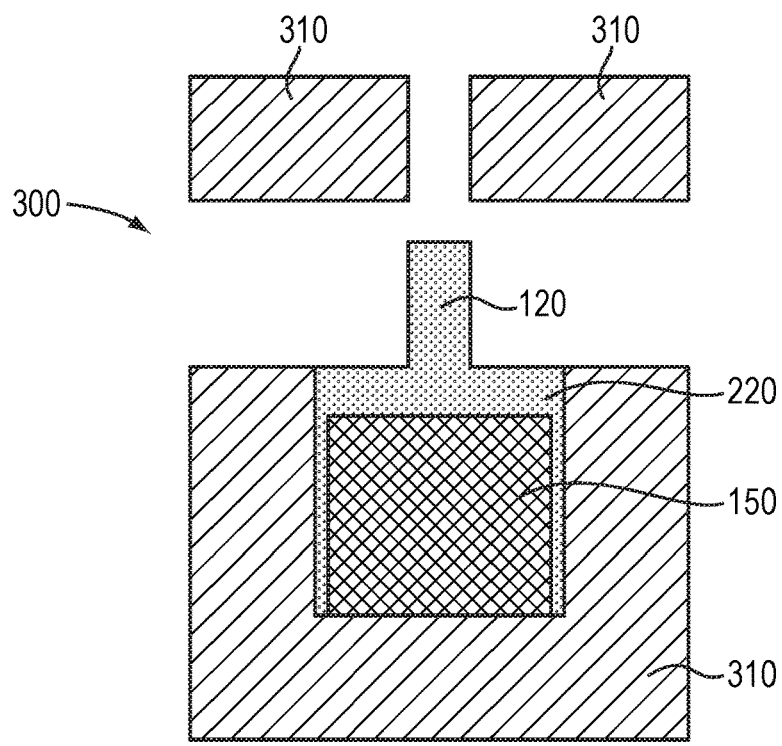
FIG. 3B is a schematic cross-section of the evaporation source of FIG. 3A with segmented insulation in an open configuration in accordance with various embodiments of the invention.

FIGS. 3A and 3B are cross-sectional schematics of an insulated thermal-evaporation source 300 featuring another configuration of segmented (i.e., modular) insulation 310 in accordance with various embodiments of the present invention. As in FIG. 2A, FIG. 3A depicts the insulation 310 being snugly positioned around the source body 220, thereby providing the maximum amount of thermal insulation for the source 300, e.g., during an evaporation process (i.e., during actual evaporation of feedstock material 150). FIG. 3B depicts the insulated source 300 in a configuration in which one or more of the segments of insulation 310 have been moved away from the source body 220, thereby enabling faster cool-down thereof. As in FIG. 2B, one or more segments of the insulation 310 may remain disposed closely proximate or even in contact with the evaporation source, even in the "open" configuration of FIG. 3B. In other embodiments, all of the segments of the insulation 310 are moved away from the source body 220 in the open configuration. Open configurations such as the configuration of FIG. 3B may be utilized, for example, after an evaporation process.

Figure 4A:
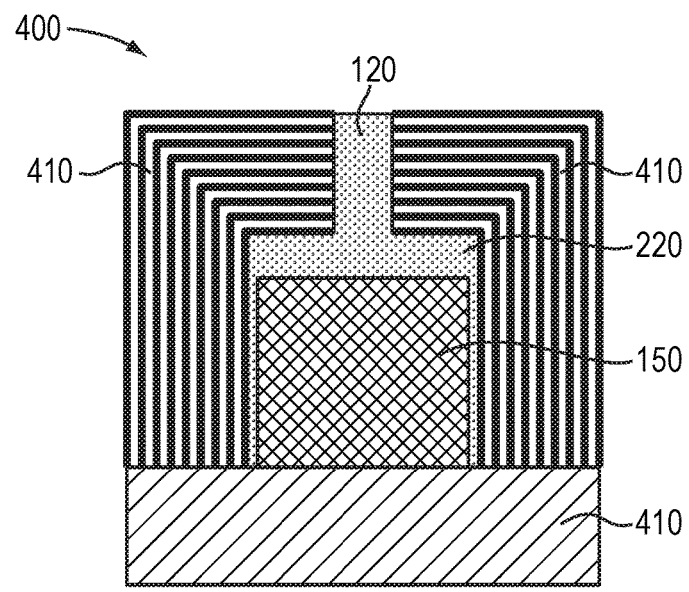
FIG. 4A is a schematic cross-section of an evaporation source having segmented insulation in a closed configuration in accordance with various embodiments of the invention.
Figure 4B:
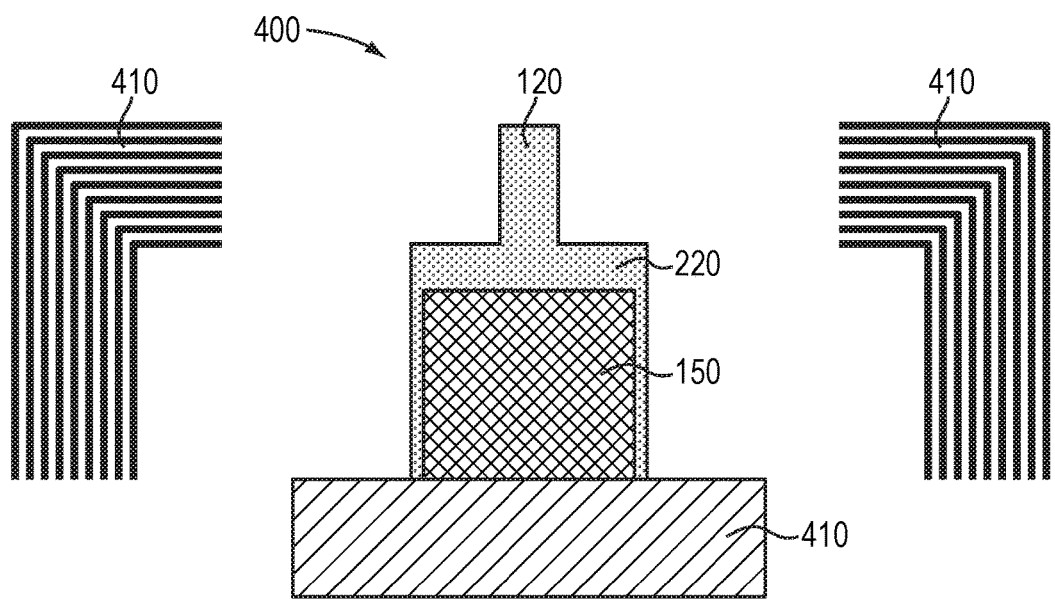
FIG. 4B is a schematic cross-section of the evaporation source of FIG. 4A with segmented insulation in an open configuration in accordance with various embodiments of the invention.

In accordance with various embodiments of the invention, the insulation material (e.g., insulation 210 and/or insulation 310) may include, consist essentially of, or consist of graphite, carbon-fiber composite (CFC) foils, felts, or foams, as well as combinations thereof. Other insulation materials in accordance with embodiments of the invention include ceramics such as mullite ($3Al_2O_3:2SiO_2$ or $2Al_2O_3:SiO_2$), alumina ($Al_2O_3$), silica ($SiO_2$), and/or zirconia ($ZrO_2$). The insulation may take the form of a sol gel, a foam, a plurality of fibers (i.e., a felt), or a series of spaced-apart shields (that may include, consist essentially of, or consist of, for example, tantalum, niobium, and/or molybdenum). For example, FIGS. 4A and 4B respectively depict closed and open configurations of an evaporation source 400 in which one or more segments of an insulation material 410 include, consist essentially of, or consist of a plurality of spaced-apart solid shields. Although FIGS. 4A and 4B depict one of the segments of insulation material 410 as being a solid section, in various embodiments all of the segments 410 surrounding the source body 220 may include, consist essentially of, or consists of a plurality of spaced-apart solid shields.

Figure 5A:
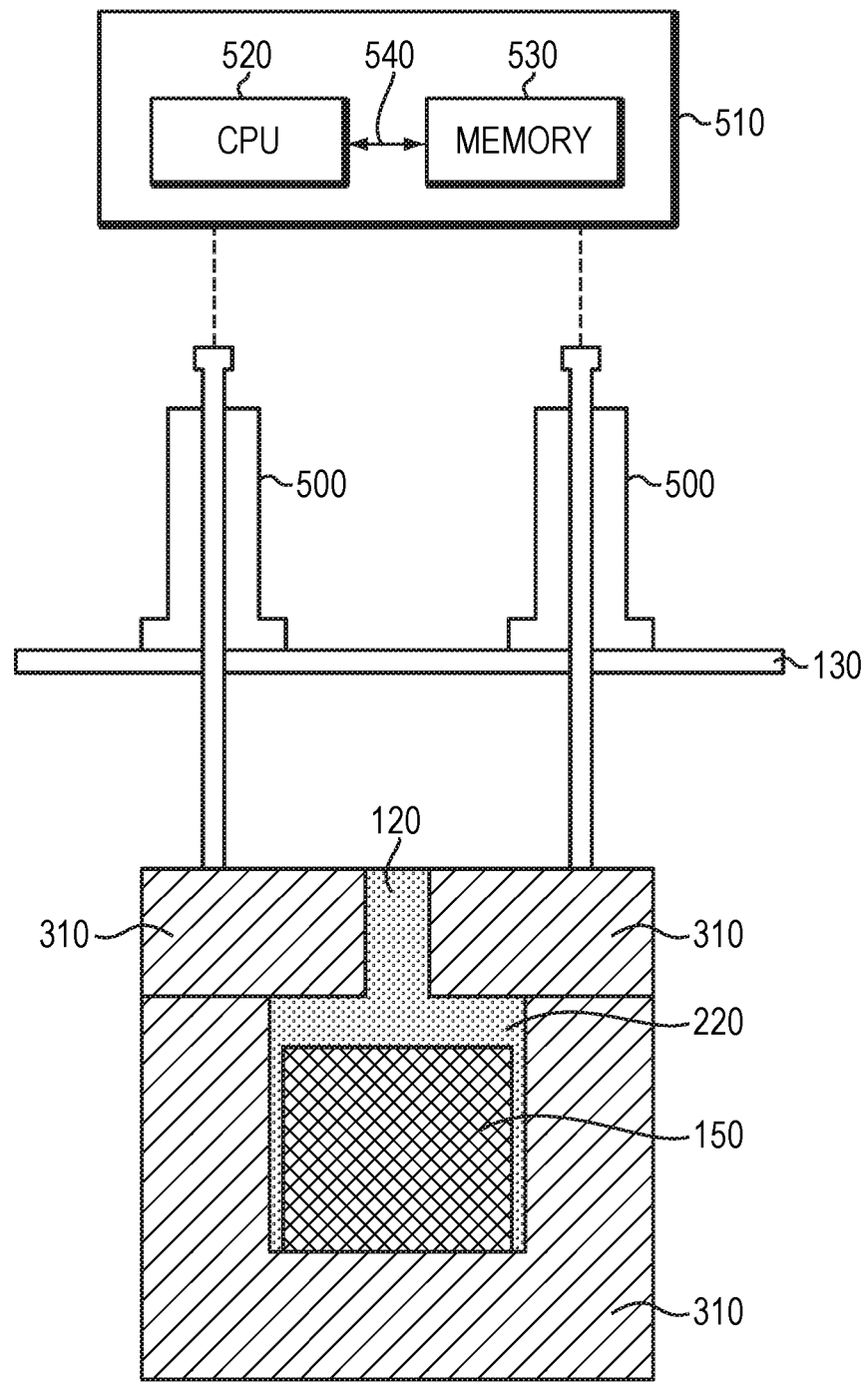
FIG. 5A is a schematic cross-section of portions of a deposition system, including (i) an evaporation source having segmented insulation in a closed configuration and (ii) apparatus for repositioning insulation in accordance with various embodiments of the invention.
Figure 5B:
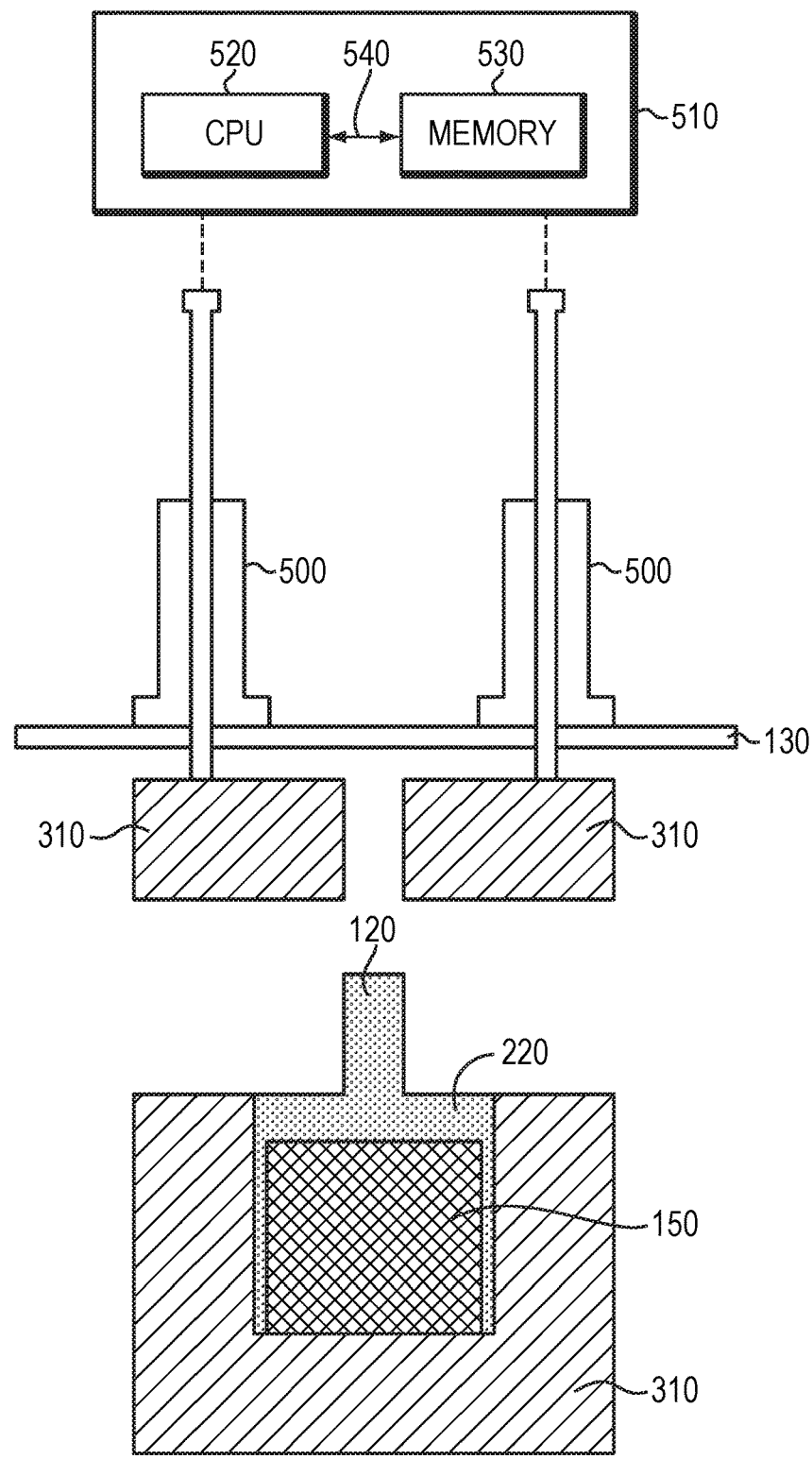
FIG. 5B is a schematic cross-section of the evaporation source of FIG. 5A with segmented insulation in an open configuration in accordance with various embodiments of the invention.

In various embodiments of the invention, the insulation segments are moved away from the source body (or vice versa) via positioners that extend into the evaporation system via vacuum feedthroughs and connect to the insulation segments (and/or to the source body). The positioners enable linear and/or rotational motion of the insulation segments. As shown in FIGS. 5A and 5B, the positioners 500 may include or consist essentially of mechanical arrangements such as actuators (e.g., linear actuators and/or rotational actuators) that extend through a wall 130 (e.g., the lid) of the evaporation system. In other embodiments, the positioners 500 may be partially or fully disposed within the evaporation system (i.e., on the same side of wall 130 as the evaporation source). The positioners 500 may be controlled via, for example, manual operation, computer control, and/ or may be pneumatically, electrically, or magnetically actuated. For example, the positioners 500 may be controlled via compressed gas (i.e., gas actuators) and a valve-based system that may be manually operated or connected to a controller (e.g., control system 510 detailed below).

In various embodiments of the present invention, a control system 510 may be electrically connected and/or mechanically connected to the positioners 500 and control the movements of the insulation segments. The computer-based control system (or "controller") 510 in accordance with embodiments of the present invention may include or consist essentially of a general-purpose computing device in the form of a computer including a processing unit (or "computer processor") 520, a system memory 530, and a system bus 540 that couples various system components including the system memory 530 to the processing unit 520. Computers typically include a variety of computer-readable media that can form part of the system memory 530 and be read by the processing unit 520. By way of example, and not limitation, computer readable media may include computer storage media and/or communication media. The system memory 530 may include computer storage media in the form of volatile and/or nonvolatile memory such as read only memory (ROM) and random access memory (RAM). A basic input/output system (BIOS), containing the basic routines that help to transfer information between elements, such as during start-up, is typically stored in ROM. RAM typically contains data and/or program modules that are immediately accessible to and/or presently being operated on by processing unit 520. The data or program modules may include an operating system, application programs, other program modules, and program data. The operating system may be or include a variety of operating systems such as Microsoft WINDOWS operating system, the Unix operating system, the Linux operating system, the Xenix operating system, the IBM AIX operating system, the Hewlett Packard UX operating system, the Novell NETWARE operating system, the Sun Microsystems SOLARIS operating system, the OS/2 operating system, the BeOS operating system, the MACINTOSH operating system, the APACHE operating system, an OPENSTEP operating system or another operating system of platform.

Any suitable programming language may be used to implement without undue experimentation the functions described herein. Illustratively, the programming language used may include assembly language, Ada, APL, Basic, C, C++, C*, COBOL, dBase, Forth, FORTRAN, Java, Modula-2, Pascal, Prolog, Python, REXX, and/or JavaScript for example. Further, it is not necessary that a single type of instruction or programming language be utilized in conjunction with the operation of systems and techniques of the invention. Rather, any number of different programming languages may be utilized as is necessary or desirable.

The computing environment may also include other removable/nonremovable, volatile/nonvolatile computer storage media. For example, a hard disk drive may read or write to nonremovable, nonvolatile magnetic media. A magnetic disk drive may read from or writes to a removable, nonvolatile magnetic disk, and an optical disk drive may read from or write to a removable, nonvolatile optical disk such as a CD-ROM or other optical media. Other removable/nonremovable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The storage media are typically connected to the system bus through a removable or non-removable memory interface.

The processing unit 520 that executes commands and instructions may be a general-purpose computer processor, but may utilize any of a wide variety of other technologies including special-purpose hardware, a microcomputer, minicomputer, mainframe computer, programmed micro-processor, micro-controller, peripheral integrated circuit element, a CSIC (Customer Specific Integrated Circuit), ASIC (Application Specific Integrated Circuit), a logic circuit, a digital signal processor, a programmable logic device such as an FPGA (Field Programmable Gate Array), PLD (Programmable Logic Device), PLA (Programmable Logic Array), RFID processor, smart chip, or any other device or arrangement of devices that is capable of implementing the steps of the processes of embodiments of the invention. For example, the memory 530 may store therewithin one or deposition (e.g., thermal-evaporation) recipes including instructions (e.g., desired thermal profiles, heating times, etc.) utilized by the controller 510 to control the various components and systems of the deposition system, e.g., heating systems, positioners 500, etc. The recipes may include indications during and/or after evaporation processes for the controller 510 to move one or more insulation segments around the evaporation source into an open configuration (and/or indications before evaporation processes for the controller 510 to move one or more insulation segments into a closed configuration), and/or such movements may be initiated via user manual control. The controller 510 may include one or more user interfaces and/or input/output devices (e.g., keyboard, display, mouse or other pointing device, etc.) for accepting user commands and/or for the inputting of recipe information. Although FIGS. 5A and 5B depict controller 510 and positioners 500 utilized in conjunction with evaporation source 300 and segments of insulation 310, controller 510 and positioners 500 may be utilized in conjunction with any evaporation source and configuration of insulation described herein.

Figure 6A:
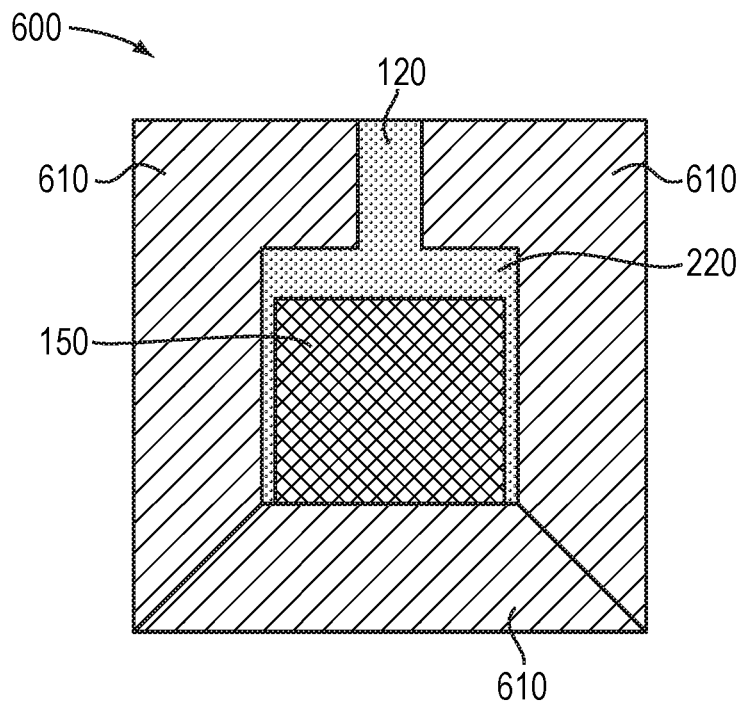
FIG. 6A is a schematic cross-section of an evaporation source having segmented insulation in a closed configuration in accordance with various embodiments of the invention.
Figure 6B:
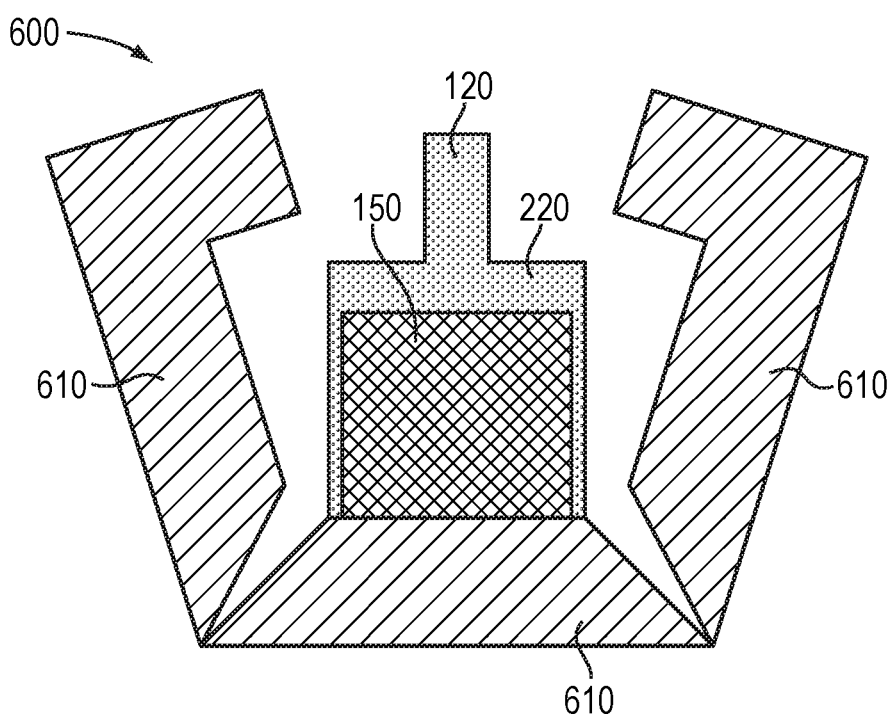
FIG. 6B is a schematic cross-section of the evaporation source of FIG. 6A with segmented insulation in an open configuration in accordance with various embodiments of the invention.

FIGS. 6A and 6B are cross-sectional schematics of another insulated thermal-evaporation source 600 that features segmented insulation 610 in accordance with various embodiments of the present invention. In FIGS. 6A and 6B, which respectively depict a closed and an open configuration of the insulated source 600, the insulation 610 disposed around the source body 220 is segmented, but the segments of insulation 610 are connected at one or more points (e.g., hinges or other connectors) that allow the separation of one or more of the segments away from the source body 220. As in FIGS. 2A and 2B, closed configurations such as the closed configuration of FIG. 6A may be utilized during evaporation processes, and the open configuration of FIG. 6B may be utilized after or between evaporation processes. The movement of the various segments of insulation 610 may be controlled by, for example, one or more positioners 500 (and/or control system 510).

Figure 7A:
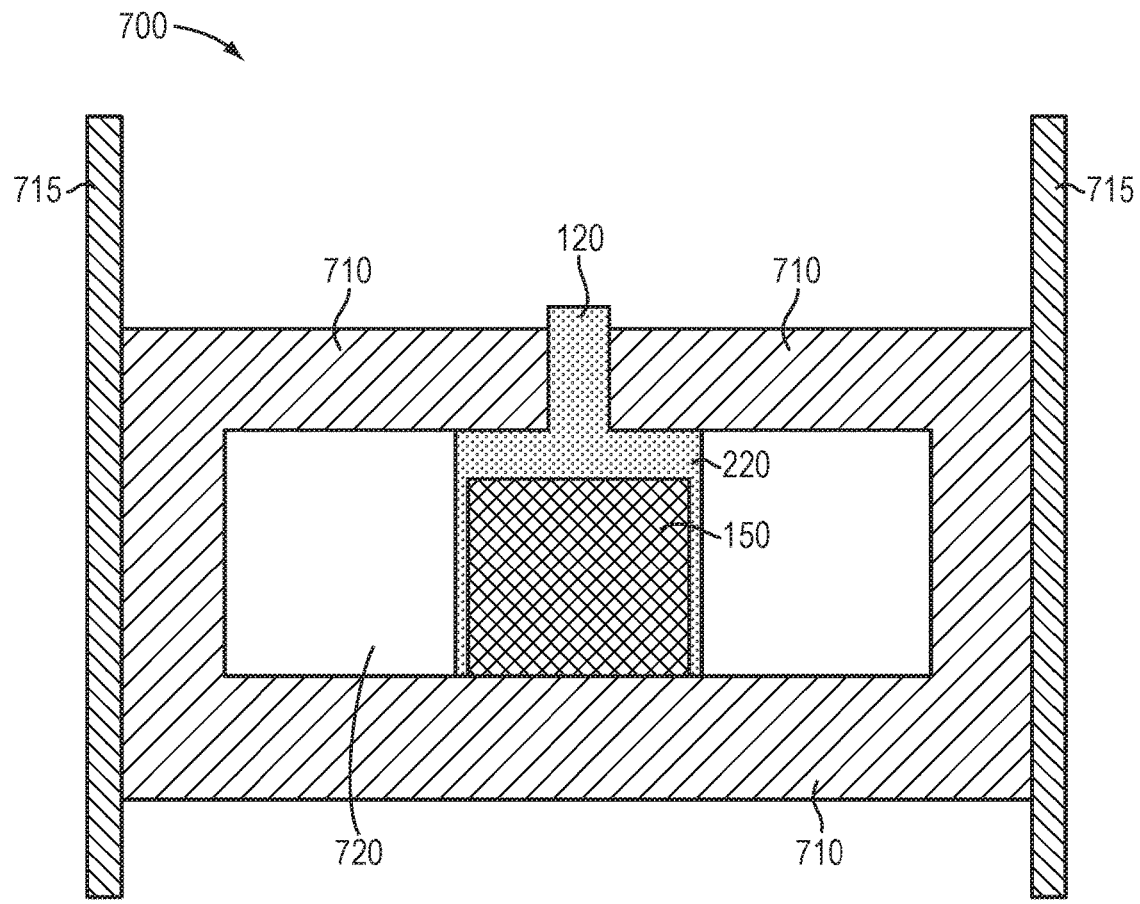
FIG. 7A is a schematic cross-section of an evaporation source having segmented insulation in a closed configuration in accordance with various embodiments of the invention.
Figure 7B:
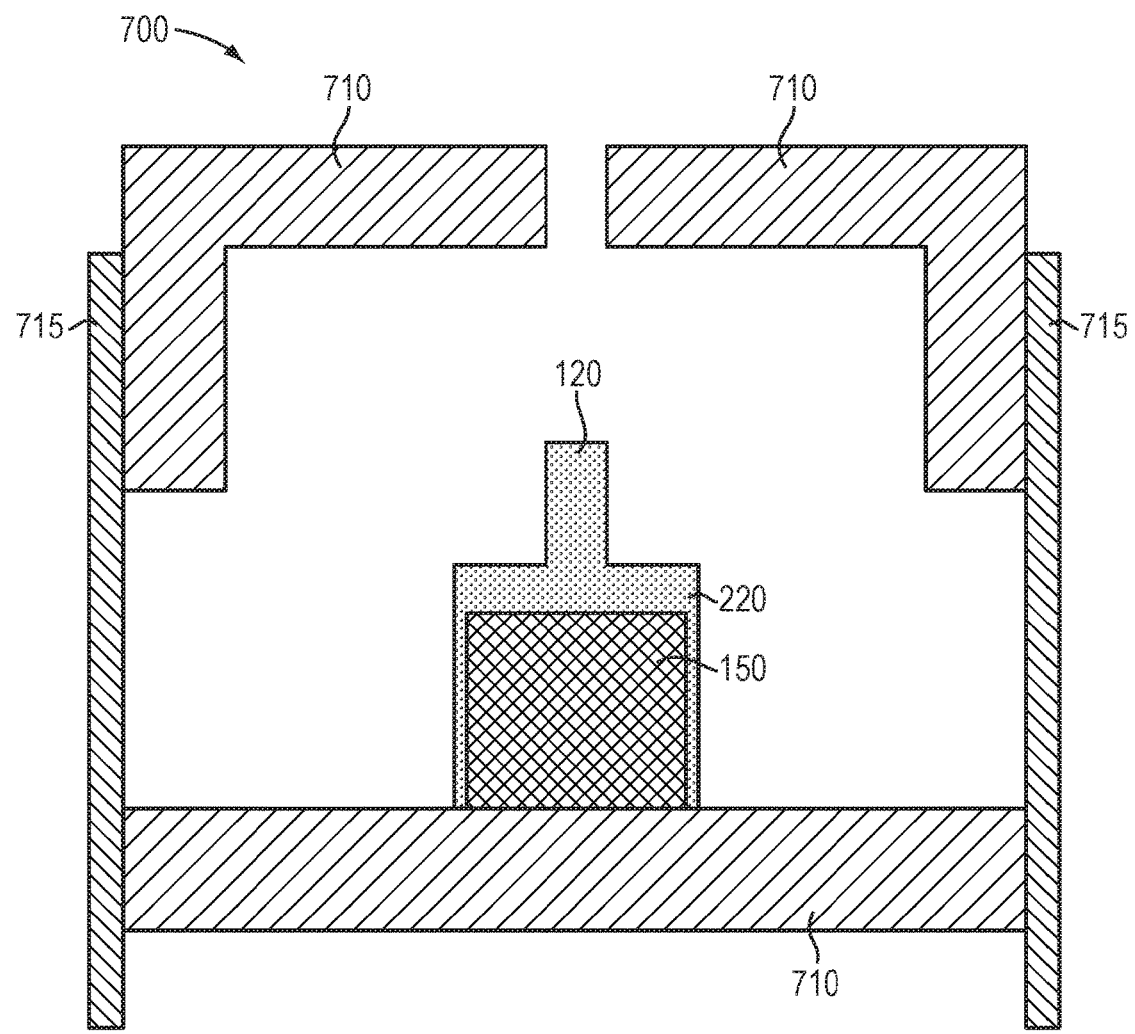
FIG. 7B is a schematic cross-section of the evaporation source of FIG. 7A with segmented insulation in an open configuration in accordance with various embodiments of the invention.

FIGS. 7A and 7B are cross-sectional schematics of another insulated thermal-evaporation source 700 that features segmented insulation 710 in accordance with various embodiments of the present invention. In FIGS. 7A and 7B, which respectively depict a closed and an open configuration of the insulated source 700, the insulation 710 disposed around the source body 220 is a portion of or connected to one or more walls 715 of the deposition chamber in which the evaporation source 700 is disposed. As shown, the insulation 710 forms an insulated chamber 720 sized and shaped to allow the evaporation source 700 to be disposed therewithin. As also shown, in various embodiments the insulation 710 is not snugly disposed around or in contact with the source body 220 on one or more sides thereof. The closed configuration of FIG. 7A, in which the insulation 710 is disposed between the source body 220 and the walls 715 (and thus prevents a line of sight therebetween) may be utilized during evaporation processes. As shown in FIG. 7B, at least a portion of the insulation 710 (e.g., one or more segments thereof) may be moved away from the source body 220 after an evaporation process (or during a temperature change within an evaporation process), permitting a line of sight between the cooler walls 715 and the source body 220. Such a line of sight with the cooler walls 715 may enable a more rapid cool-down of the source body 220 and the feedstock material 150 therewithin. A wall 715 may include, consist essentially of, or consist of one or more chamber walls (e.g., wall 130) that enclose the deposition system and isolate it from the outside environment, and/or one or more interior walls, protrusions, or other structures interior to the deposition system that may be actively cooled or may simply not reach temperatures as high as that reached by the evaporation source (i.e., the wall(s) may not themselves be actively heated as is the evaporation source).

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method of thin-film deposition, the method comprising:
  providing within a deposition chamber an evaporation source comprising (i) a source body containing a feedstock material, and (ii) an evaporation port fluidly coupling the source body with an interior of the deposition chamber;
  disposing an insulation material around the evaporation source to reduce heat loss therefrom;
  establishing a processing ambient within the deposition chamber by at least one of (i) evacuating at least a portion of gas disposed within the deposition chamber, thereby establishing a vacuum ambient therein, or (ii) introducing a process gas within the deposition chamber;

heating the evaporation source with the insulation material disposed around the evaporation source in a first position, whereby at least a portion of the feedstock material vaporizes, exits the source body through the evaporation port, and is deposited on a substrate within the deposition chamber, thereby forming at least a portion of a thin film;

after the at least a portion of the thin film is formed, and within the processing ambient, moving at least a portion of the insulation material away from the evaporation source to a second position during cooling of the evaporation source, thereby enhancing heat loss therefrom; and while remaining in the processing ambient and after a temperature of the evaporation source has decreased by a desired amount, disposing the at least a portion of the insulation material proximate the evaporation source in the first position to reduce heat loss from the evaporation source.

2. The method of claim 1, wherein (i) the process gas is introduced within the deposition chamber, and (ii) the process gas reacts with the vaporized feedstock material.

3. The method of claim 1, wherein (i) the insulation material comprises a plurality of discrete segments, and (ii) moving at least a portion of the insulation material away from the evaporation source comprises moving one or more of the segments away from the evaporation source.

4. The method of claim 3, wherein one or more segments of the insulation material remain disposed proximate the evaporation source when one or more other segments of the insulation material are moved away from the evaporation source.

5. The method of claim 1, wherein moving at least a portion of the insulation material away from the evaporation source comprises establishing a line of sight between at least a portion of the source body and an interior wall of the deposition chamber, the interior wall having a temperature lower than a temperature of the evaporation source.

6. The method of claim 1, wherein the insulation material comprises at least one of carbon or a ceramic material.

7. The method of claim 1, wherein the insulation material comprises at least one of graphite, carbon fiber, mullite, alumina, silica, or zirconia.

8. The method of claim 1, wherein the insulation material comprises at least one of tantalum, niobium, or molybdenum.

9. The method of claim 1, wherein the insulation material comprises a felt, a foam, a sol gel material, or a plurality of spaced-apart solid shields.

10. The method of claim 1, wherein moving at least a portion of the insulation material away from the evaporation source comprises opening the insulation material at one or more hinged points.

11. The method of claim 1, wherein, in both the first and second positions, the insulating material is disposed between the source body and a heat source that heats the evaporation source.

12. A method of thin-film deposition, the method comprising:

providing within a deposition chamber an evaporation source comprising (i) a source body containing a feedstock material, and (ii) an evaporation port fluidly coupling the source body with an interior of the deposition chamber;

insulating the evaporation source to reduce heat loss therefrom;

establishing a processing ambient within the deposition chamber by at least one of (i) evacuating at least a portion of gas disposed within the deposition chamber, thereby establishing a vacuum ambient therein, or (ii) introducing a process gas within the deposition chamber;

while the evaporation source is insulated, heating the evaporation source, whereby at least a portion of the feedstock material vaporizes, exits the source body through the evaporation port, and is deposited on a substrate within the deposition chamber, thereby forming at least a portion of a thin film;

after the at least a portion of the thin film is formed, and within the processing ambient, reducing the insulation of the evaporation source during cooling of the evaporation source, thereby enhancing heat loss therefrom; and while remaining in the processing ambient and after a temperature of the evaporation source has decreased by a desired amount, increasing the insulation of the evaporation source to reduce heat loss therefrom.

13. The method of claim 12, wherein (i) the process gas is introduced within the deposition chamber, and (ii) the process gas reacts with the vaporized feedstock material.

14. The method of claim 12, wherein (i) insulating the evaporation source comprises disposing a plurality of discrete segments of insulation material around the evaporation source, and (ii) reducing the insulation of the evaporation source comprises moving one or more of the segments away from the evaporation source.

15. The method of claim 14, wherein one or more segments of the insulation material remain disposed proximate the evaporation source when one or more other segments of the insulation material are moved away from the evaporation source.

16. The method of claim 14, wherein moving one or more of the segments away from the evaporation source comprises opening the insulation material at one or more hinged points.

17. The method of claim 12, wherein reducing the insulation of the evaporation source comprises establishing a line of sight between at least a portion of the source body and an interior wall of the deposition chamber, the interior wall having a temperature lower than a temperature of the evaporation source.

18. The method of claim 12, wherein insulating the evaporation source comprises disposing an insulation material around the evaporation source.

19. The method of claim 18, wherein the insulation material comprises at least one of carbon or a ceramic material.

20. The method of claim 18, wherein the insulation material comprises at least one of graphite, carbon fiber, mullite, alumina, silica, or zirconia.

21. The method of claim 18, wherein the insulation material comprises at least one of tantalum, niobium, or molybdenum.

22. The method of claim 18, wherein the insulation material comprises a felt, a foam, a sol gel material, or a plurality of spaced-apart solid shields.

23. The method of claim 18, wherein the insulating material is disposed between the source body and a heat source that heats the evaporation source.

\* \* \* \* \*